US006974524B1

(12) United States Patent
Jaso et al.

(10) Patent No.: US 6,974,524 B1
(45) Date of Patent: *Dec. 13, 2005

(54) APPARATUS, METHOD AND SYSTEM FOR MONITORING CHAMBER PARAMETERS ASSOCIATED WITH A DEPOSITION PROCESS

(75) Inventors: Mark A. Jaso, Fairfax Station, VA (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

This patent is subject to a terminal disclaimer.

(21) Appl. No.: 10/609,297

(22) Filed: Jun. 27, 2003

Related U.S. Application Data

(63) Continuation-in-part of application No. 10/352,699, filed on Jan. 27, 2003, now Pat. No. 6,811,657.

(51) Int. Cl.[7] .................. C23C 14/34; G01N 17/00
(52) U.S. Cl. .................. 204/192.13; 204/298.03; 73/1.86; 73/86; 73/866; 73/432.1
(58) Field of Search .................. 204/298.03, 192.13; 73/1.89, 86, 866, 432.1

(56) References Cited

U.S. PATENT DOCUMENTS

| | | | |
|---|---|---|---|
| 4,374,722 A | 2/1983 | Zega | 204/298.03 |
| 4,407,708 A | 10/1983 | Landau | 204/192.13 |
| 4,545,882 A | 10/1985 | McKelvey | 204/192.13 |
| 4,894,132 A | 1/1990 | Tanaka | 204/192.13 |
| 4,957,605 A | 9/1990 | Hurwitt et al. | 204/192.12 |
| 4,983,269 A | 1/1991 | Wegmann | 204/192.13 |
| 5,380,419 A | 1/1995 | Eggers et al. | 204/298.03 |
| 5,534,997 A | 7/1996 | Schrader | 356/301 |
| 5,540,821 A | 7/1996 | Tepman | 204/192.13 |
| 5,719,495 A | 2/1998 | Moslehi | 324/158.1 |
| 5,858,464 A | 1/1999 | Littau et al. | 427/237 |
| 6,008,888 A | 12/1999 | Nottke et al. | 356/71 |
| 6,330,253 B1 * | 12/2001 | Tuganov et al. | 372/9 |
| 6,390,019 B1 | 5/2002 | Grimbergen et al. | 118/723 R |
| 6,416,635 B1 | 7/2002 | Hurwitt et al. | 204/192.13 |
| 6,421,132 B1 | 7/2002 | Brajovic | 356/602 |
| 6,480,265 B2 | 11/2002 | Maimon et al. | 356/4.07 |
| 6,486,948 B1 | 11/2002 | Zeng | 356/301 |
| 6,811,657 B2 * | 11/2004 | Jaso | 204/192.13 |

* cited by examiner

*Primary Examiner*—Steven Versteeg
(74) *Attorney, Agent, or Firm*—TraskBritt

(57) ABSTRACT

Apparatus and methods for measuring characteristics of a metallic target as well as other interior surfaces of a sputtering chamber. The apparatus includes a sensor configured to emit an energy beam toward a surface of interest and to detect an energy beam therefrom, the detected energy beam being indicative of parameters of a characteristic of interest of the surface of interest. Quantitative and qualitative characteristics of interest may be determined. A sputtering system including the apparatus and operable according to the methods of the invention is also disclosed.

50 Claims, 7 Drawing Sheets

APPARATUS, METHOD AND SYSTEM FOR MONITORING CHAMBER PARAMETERS ASSOCIATED WITH A DEPOSITION PROCESS

CROSS-REFERENCE TO RELATED APPLICATIONS

This application is a continuation-in-part of U.S. patent application Ser. No. 10/352,699, entitled "Device for Measuring the Profile of a Metal Film Sputter Deposition Target, and System and Method Employing Same," filed Jan. 27, 2003, now U.S. Pat. No. 6,811,657 issued on Nov. 2, 2004, the disclosure of which application is incorporated herein by reference.

BACKGROUND OF THE INVENTION

1. Field of the Invention

The present invention relates generally to sputter deposition of materials on substrate surfaces. More specifically, the present invention relates to methods and apparatus for measuring characteristics of a sputtering target and other surfaces within a sputtering vacuum chamber.

2. State of the Art

A thin film of metallic material may be deposited on a substrate using a sputter deposition process wherein a metallic target is attacked with ions, causing atoms or small particles of the target to be ejected from the target and deposited on the substrate surface. FIG. 1 illustrates a cross-sectional schematic of a conventional sputtering apparatus 10 comprising a vacuum chamber 12 having inner chamber walls 13, a gas inlet 14 and a gas outlet 16. The vacuum chamber 12 may further include a window 15 comprising a material that is transparent to predetermined wavelengths of electromagnetic radiation. The sputtering apparatus 10 further comprises a substrate support pedestal 24 and a metallic target 22 attached to a sputtering cathode assembly 18, each located within the vacuum chamber 12. The pedestal 24 may be configured to secure a substrate 26 thereto with a biasable electrostatic chuck, a vacuum chuck, a clamping structure, or a combination of methods. The substrate 26 may be transported to and from the pedestal 24 manually or with a robotic arm or blade (not shown).

During the sputtering process, the vacuum chamber 12 is filled with an inert gas, such as argon, through the gas inlet 14 and then reduced to a near vacuum through the gas outlet 16. The target 22 is negatively charged to cause electrons to be emitted from an exposed surface 23 of the target 22 and move toward an anode (not shown). A portion of the moving electrons strike atoms of the inert gas, causing the atoms to become positively ionized and move towards the negatively charged target 22. The electrons, inert gas atoms, and ions form a plasma which is typically intensified and confined over the target surface 23 by a magnetic field generated by a magnet assembly 20 located proximate the target 22. The magnet assembly 20 may comprise one or more permanent magnets or electromagnets located behind and/or to the side of the target 22. A portion of the ions discharging from the plasma strikes the target surface 23 at a high velocity, causing atoms or small particles of the target 22 material to be ejected from the target surface 23. The ejected atoms or small particles then travel through the vacuum chamber 12 until they strike a surface, such as the surface of the substrate 26, forming a thin metallic film thereon.

Residue deposits comprising the ejected atoms or small particles and byproducts are also deposited on the inner chamber walls 13 and other surfaces within the sealed vacuum chamber 12 during the deposition process. The accumulation of the residue deposits on the inner chamber walls 13 may be a source of contamination as a plurality of substrates 26 is successively processed in the vacuum chamber 12. Thus, the vacuum chamber 12 must be opened to atmosphere and cleaned after a predetermined amount of operation time has elapsed under vacuum or when contamination is detected on a substrate 26 that has undergone the deposition process. Opening and cleaning the vacuum chamber 12 is costly and time consuming. Therefore, it would be advantageous to clean the vacuum chamber 12 only when a predetermined amount of residue deposits have accumulated on the inner chamber walls 13 and other surfaces within the vacuum chamber 12.

The magnetic field formed over the target surface 23 by the magnet assembly 20 confines the electrons emitted from the target 22 to an area near the target surface 23. This greatly increases the electron density and the likelihood of collisions between the electrons and the atoms of the inert gas in the space near the target surface 23. Therefore, there is a higher rate of ion production in plasma regions near the target surface 23 where the magnetic field intensity is stronger. Varying rates of ion production in different plasma regions causes the target surface 23 to erode unevenly. Typically, the configuration of the magnet assembly 20 produces a radial variation of thick and thin areas, or grooves, within a diameter of the target surface 23. FIG. 2 illustrates a cross-sectional perspective view of a typical erosion profile of a cylindrical metallic target 22, such as the metallic target 22 shown in FIG. 1, which has been used in a sputtering process. FIG. 2 illustrates a target surface 23 before erosion has occurred as well as an eroded target surface 32 that has eroded unevenly across the length of a diameter of the target 22. Due to the geometry of a magnetic field surrounding the target 22, the target surface 32 has eroded nearly symmetrically about a center line 30 dividing the length of the diameter.

Referring now to FIGS. 1 and 2, the target 22 may comprise a rare metal, such as gold, platinum, palladium or silver, or may comprise, for example, aluminum, titanium, tungsten or any other target material conventionally employed in the semiconductor industry. Therefore, it is advantageous to consume as much of the target 22 material during sputter deposition processes as possible before replacing an eroded target 22. Further, replacing an eroded target 22 before the end of its useful life may be a difficult and time-consuming task. However, it is important to replace the target 22 before a groove "punches through" the target 22 material and exposes portions of the cathode assembly 18 to erosion, causing damage to the cathode assembly 18 and contaminating the sputtering apparatus 10. For example, the target 22 material in the area of grooves 28 shown in FIG. 2 may erode before the remainder of the target 22 material and expose the cathode assembly 18 to ionic bombardment from the surrounding plasma.

It may also be advantageous to replace or condition the sputtering target 22 when certain characteristics of the target surface 23 become degraded during the sputtering process. For example, the smoothness of the target surface 23 may degrade over time. The roughened target surface 23 may affect the consistency of the deposition formation on the substrate 26 and may also be an indication of the amount of target 22 consumption. Therefore, it may be advantageous to replace the target 22 when the target surface 23 reaches a predetermined roughness level.

As another example of degraded target surface 23 characteristics, certain targets 22, such as targets 22 comprising $Ag_2Se$ (hereinafter "silver selenide"), may exhibit hair-like growths or asperities (not shown) during the sputtering process. A portion of the asperities may be ejected from the target surface 23 during the plasma ion bombardment and land on substrate 26, forming defects therein. Typically, by the time the asperities have grown on the target surface 23 so as to create noticeable defects on the substrate 26, the target 22 is no longer useful and must be replaced. Therefore, to avoid forming defects on the substrate 26 and to prolong the useful life of the target 22, it may be advantageous to detect the asperities while the vacuum chamber 12 is under vacuum.

The useful life of a metallic sputtering target 22 is typically estimated by determining the cumulative deposition time for the target 22. A deposition time is chosen in an attempt to guarantee that the target 22 material will never be completely removed at any given location and may take into account the thickness of the target 22, the material used for the target 22, and the effect of intensifying and confining the plasma over the target surface 23 by a magnetic field generated by the magnet assembly 20 in a predetermined configuration. However, if the characteristics of the plasma distribution change due, for example, to reconfiguring the magnet assembly 20 to produce a magnetic field with a different geometry, the erosion of the target surface 23 may be changed and could result in localized enhanced metal removal and the possible punching through of target 22 to the cathode assembly 18 before the expiration of the estimated deposition time.

Directly measuring the characteristics of the target surface 23 or the vacuum chamber 12 is difficult and time consuming. Opening the vacuum chamber 12 to inspect the target surface 23 or inner chamber walls 13 requires several hours of idle time while the vacuum chamber 12 is baked out under post-vacuum inspection. Accurate measurement of the target surface 23 while the sputtering apparatus 10 is under vacuum is difficult because the gap distance d between the target 22 and the pedestal 24 may be as small as 25 millimeters. Typical measurement devices are too large to be inserted into the gap between the target 22 and the pedestal 24 to profile the target surface 23 while the vacuum chamber 12 is under vacuum. Further, measurement devices placed near the target 22 during a sputtering process may be damaged by exposure to metal deposition.

In view of the above-noted shortcomings in the art, it would be advantageous to prevent contamination from residue deposits on the inner chamber walls 13 and other surfaces and to prevent premature replacement, over-consumption or degradation of the target 22 by providing a technique and device to measure the inner chamber walls 13 and the target surface 23 while the vacuum chamber 12 is under vacuum.

BRIEF SUMMARY OF THE INVENTION

The present invention, in a number of embodiments, relates to methods and apparatus for measuring the characteristics of a metallic sputtering target and other surfaces within a sputtering chamber.

An apparatus according to one embodiment of the present invention may comprise a sensor configured to emit a first energy beam toward a target surface and to detect a second energy beam emitted from the target surface. The sensor may be coupled to a thin profile arm configured to move or transport the sensor over the target surface between the target and a substrate support pedestal to a plurality of measurement locations. The arm may be configured to attach to a robotic device. The sensor and the arm are configured, positioned and sized to be inserted into a narrow gap existing between the target surface and the pedestal. The arm may also be configured to remove the sensor from the gap and to shield the sensor during a sputtering process.

In another embodiment of the present invention, the sensor may comprise a source element configured to emit a collimated light beam and at least one detector. According to one aspect of the invention, the at least one detector is arranged as a linear array of detection elements and the source element is positioned so as to emit the collimated light beam at an acute angle with respect to the linear array. The linear array is positioned relative to the source element so as to be illuminated by a reflection of the collimated light beam. The distance from the sensor to the target surface or the percentage of target erosion may be calculated by determining the location in the array of the detection element or elements illuminated by the reflection of the collimated light beam. According to another aspect of the invention, the at least one detector may be configured, positioned and sized to collect a coherent reflection of the collimated light beam and a substantial portion of scattered light beams from the target surface. The roughness of the target surface may be calculated by comparing the coherent reflection and scattered light beams. According to a further aspect of the invention, the sensor may comprise a source configured to emit an energy beam substantially parallel to the target surface toward the at least one detector. The presence of asperities on the target surface may be detected by analyzing the energy beam after passing proximate to the target surface.

An apparatus according to yet another embodiment of the present invention may comprise a sensor configured to emit a first energy beam toward a surface in a chamber and to detect a second energy beam emitted from the surface to analyze residue deposits thereon. The sensor may be coupled to a thin profile arm configured to move or transport the sensor proximate to the surface. Alternatively, the sensor may be positioned outside the chamber and configured to emit the energy beam through a window in the chamber. The sensor may be configured to perform a spectral analysis on the second energy beam.

In yet another embodiment of the present invention, a sensor may comprise a transmitter optically coupled to a source collimator configured to collimate a light beam as it exits an optical fiber. The sensor may further comprise a receiver optically coupled to one or more collection collimators, each collection collimator being configured to collect a light beam incident thereon into a corresponding optical fiber.

The present invention, in additional embodiments, also encompasses a sputter deposition system incorporating the sensors of the present invention and methods of measuring surface characteristics.

One method according to the present invention comprises emitting an energy beam, illuminating a first location on a target surface, detecting a reflection of the energy beam from the first location, and analyzing the detected reflection of the energy beam to determine a distance from the point of emission to the first location. Another method according to the present invention comprises detecting a coherently reflected portion of an energy beam from a target surface, detecting a scattered portion of the energy beam, and relating the coherently reflected portion and the scattered portion to a surface roughness. Yet another method according to the present invention comprises emitting an energy beam substantially parallel to a target surface, measuring a change to the energy beam, and relating the change to a presence of asperities on the target surface. A further method according to the present invention comprises performing a spectral analysis on an energy beam received from a surface.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate what are currently considered to be best modes for carrying out the invention.

DETAILED DESCRIPTION OF THE INVENTION

Figure 1:
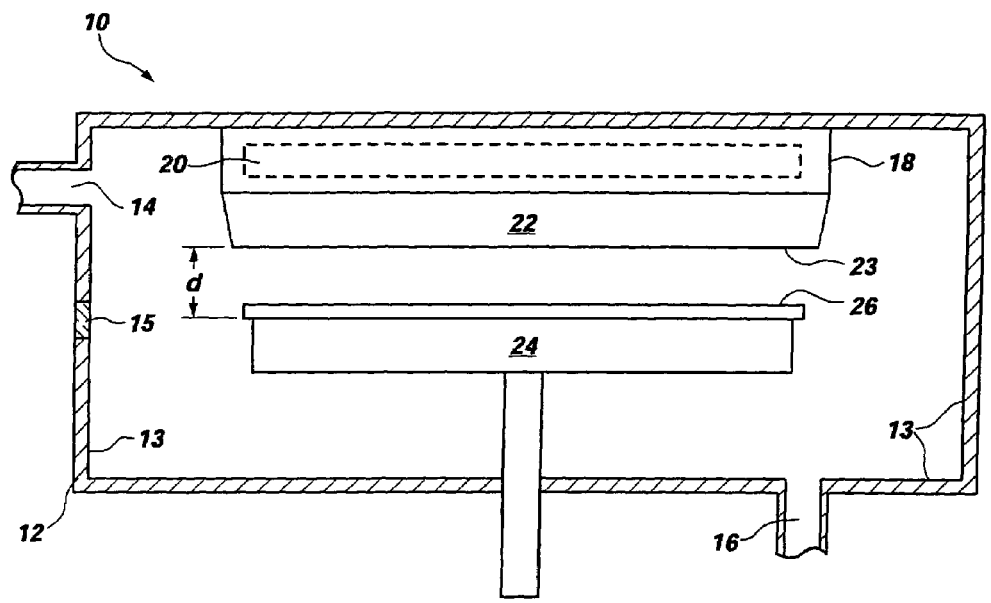
FIG. 1 is a cross-sectional side view schematic of a sputtering apparatus.
Figure 3A:
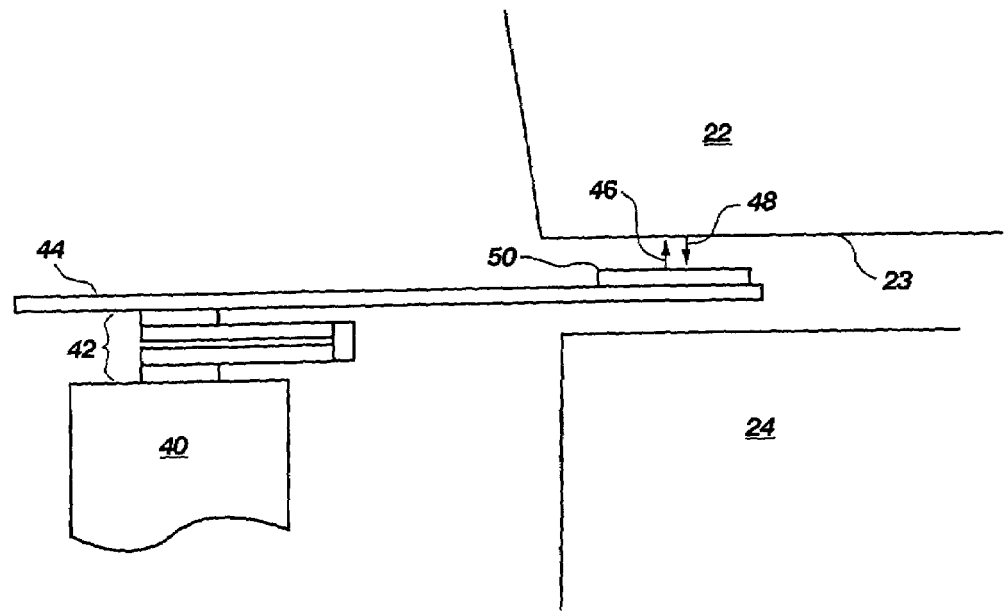
FIGS. 3A–3C are cross-sectional side view schematics according to the present invention of a portion of a sputtering apparatus comprising a sensor configured, sized and positioned to be inserted between a target surface and a pedestal or near a vacuum chamber wall.
Figure 3B:
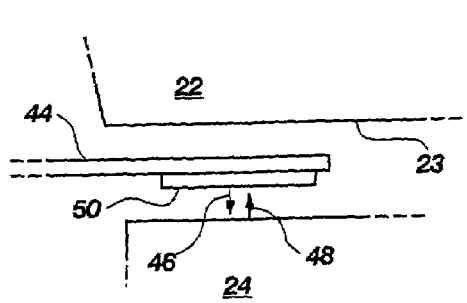
Figure 3C:
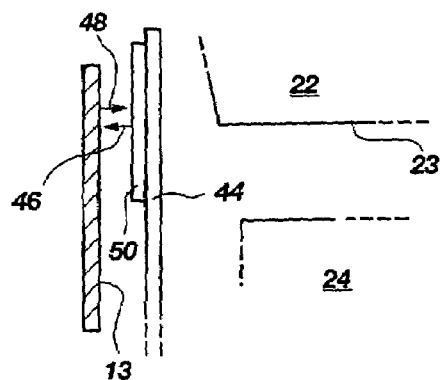

FIGS. 3A–3C each illustrate a cross-sectional schematic according to the present invention of a portion of a sputtering apparatus, such as the sputtering apparatus 10 shown in FIG. 1, wherein a sensor 50 is positioned relative to a surface of an inner chamber wall 13, a surface of pedestal 24 or surface 23 of target 22 to be analyzed. As shown in FIG. 3A, a sensor 50 coupled to a thin profile arm 44 is configured and sized to be inserted into a gap between a target 22 and a pedestal 24. The arm 44 may be configured to detachably attach to a chamber robot 40 configured to translate the sensor 50 over the target surface 23, or at least a portion thereof. The chamber robot 40 may further be configured to protect the sensor 50 during the sputtering process by removing the sensor 50 from the sputtering area or by shielding the sensor 50. The arm 44 may be interconnected to the chamber robot 40 through an articulating arm 42 configured to provide movement in at least one plane. In another embodiment of the present invention, the sensor 50 may detachably attach to a substrate pickup arm (not shown) connected to the chamber robot 40 and configured to transport a substrate (not shown) to and from the pedestal 24 using a pickup device (not shown), such as a clamp, vacuum chuck or electrostatic chuck, to attach the substrate thereto. In yet another embodiment, the sensor 50 may be configured to attach directly to the pickup device.

As shown in FIG. 3A, the sensor 50 is sized, positioned and configured to measure the characteristics of the target surface 23 by transmitting a signal 46 toward the target 22 and receiving a reflected or emitted signal 48 from the target surface 23. The transmitted signal 46 may be an energy beam selected from the group comprising a visible light beam, an ultraviolet light beam, an infrared (hereinafter "IR") light beam, a radio frequency (hereinafter "RF") beam, a microwave beam and an ultrasound beam. To profile the target surface 23, the chamber robot 40 may be configured to position the sensor 50 at a plurality of locations relative to the target surface 23. Further, the sensor 50 may be configured, such as by using a multiplexor, to scan a portion (as opposed to a single point) on the target surface 23 while positioned at one location relative to the target surface 23.

As shown in FIG. 3B, the sensor 50 may be sized, positioned and configured to measure the characteristics of the pedestal 24 by transmitting the signal 46 toward the pedestal 24 and receiving the reflected or emitted signal 48 from the pedestal 24. Alternatively, although not shown in FIG. 3B, the sensor 50 may be positioned and configured to measure the characteristics of the substrate 26 shown in FIG. 1 or deposits thereon. For example the sensor 50 may be configured to detect deposition defects on the substrate 26 or to detect when the deposition process is complete.

As shown in FIG. 3C, the sensor 50 is sized, positioned and configured to measure the characteristics of an inner chamber wall 13 by transmitting the signal 46 toward the inner chamber wall 13 and receiving the reflected or emitted signal 48 from the inner chamber wall 13. Similarly, the sensor 50 may be sized, positioned and configured to measure the characteristics of any surface in the vacuum chamber 12. Alternatively, although not shown in FIGS. 3A–3C, the sensor 50 may be positioned outside the vacuum chamber 12 and configured to pass the transmitted signal 46 through the window 15 shown in FIG. 1 such that the transmitted signal 46 may reflect off one or more surfaces within the vacuum chamber 12 and exit the vacuum chamber 12 as reflected or emitted signal 48 through the same window 15, or a different window (not shown).

The surface characteristics measured by the sensor 50 shown in FIGS. 3A–3C may be obtained, for example, through spectroscopy techniques utilizing the absorption, emission, or scattering of electromagnetic radiation by atoms or molecules on the surface being analyzed to qualitatively or quantitatively study the atoms or molecules, or to analyze physical processes occurring on the surface. Referring to FIG. 3C, spectroscopy may be used to measure the amount and composition of residue deposits on the inner chamber wall 13. In one embodiment of the present invention, the signal 46 transmitted toward the inner chamber wall 13 is an IR light beam and the absorption spectrum of the residue deposits on the inner chamber wall 13 is measured using IR absorption spectroscopy. IR absorption spectroscopy is the measurement of the wavelength and intensity of the absorption of the IR light by the inner chamber wall 13 and the residue deposits thereon. As discussed in relation to FIG. 12C below, Fourier-transform infrared (hereinafter "FTIR") spectroscopy may be used, for example, to measure the absorption spectrum using Fourier-transform techniques and a Michelson interferometer.

In another embodiment of the present invention, Raman spectroscopy is used to measure the amount and composition of residue deposits on the inner chamber wall 13. When the transmitted signal 46 illuminates the surface of the inner chamber wall 13, a portion of the transmitted signal 46 is scattered in various directions. Light scattered due to vibrations in molecules or optical phonons in solids is Raman scattered light. When the transmitted signal 46 strikes the inner chamber wall 13 or the residue deposits thereon, the light is scattered elastically (i.e., Rayleigh scattering) and inelastically (i.e., Raman scattering), generating Stokes and anti-Stokes lines. In the present embodiment, the reflected or emitted signal 48 represents a Raman scattered beam. Raman spectroscopy is the measurement of the wavelength and intensity of the inelastically scattered light of reflected or emitted signal 48 from the inner chamber wall 13 or the residue deposits thereon. The Raman scattered light of reflected or emitted signal 48 occurs at wavelengths that are shifted from the transmitted signal 46 by the energies of molecular vibrations. Raman spectroscopy may provide structure determination, multicomponent qualitative analysis, and quantitative analysis of the residue deposits on the inner chamber wall 13. The mechanism of Raman scattering is different from that of IR absorption. Therefore, Raman spectroscopy and IR absorption spectroscopy may each be used to provide complementary information about the residue deposits on the inner chamber wall 13.

Figure 2:
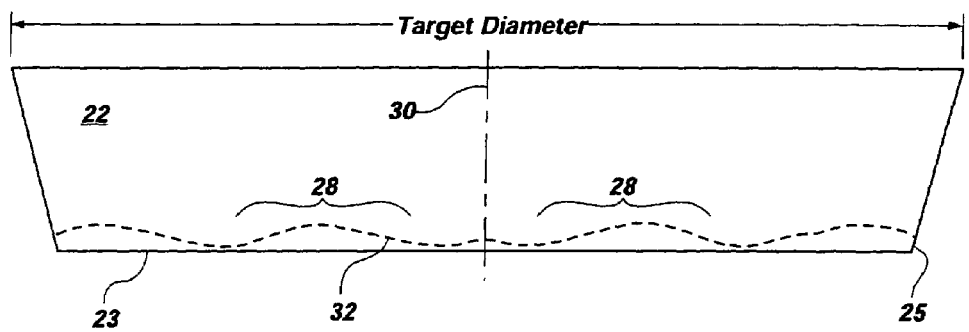
FIG. 2 is a cross-sectional perspective side view of an erosion profile of a cylindrical, metallic target.

Returning to FIG. 3A, to determine the amount of erosion at any location on the target surface 23, the reflected or emitted signal 48 may be analyzed to determine a relative distance between the sensor 50 and the target surface 23. It may not be necessary to measure the relative distance between the sensor 50 and the target surface 23 at every point on the target surface 23. Due to the radial symmetry of the erosion of the target surface 23, it is only necessary to determine the relative distance between the sensor 50 and the target surface 23 at points located linearly between the center line 30 of the target surface 23 and an outside edge 25 of the target surface 23, as shown in FIG. 2. Thus, measuring the relative distance between the sensor 50 and the target surface 23 approximately every ten millimeters linearly between the center line 30 and an outside edge 25 may provide sufficient resolution to prevent punching through a target 22 having a diameter of approximately thirty centimeters.

In one embodiment of the present invention, the relative distance between the sensor 50 and the target surface 23 is measured by measuring the time delay between the emission of the transmitted signal 46 and detection of the reflected or emitted signal 48, multiplying the measured time delay by the speed of the transmitted signal 46 and dividing by two. In another embodiment, the distance between the sensor 50 and the target surface 23 may be determined by indirectly establishing the time delay by measuring a phase difference between the transmitted signal 46 and the reflected or emitted signal 48. In a phase measurement sensor 50, the transmitted signal 46 may comprise a modulated signal. In yet another embodiment, the transmitted signal 46 may be a pulsed signal and the reflected or emitted pulse signal 48 may be detected only during a predetermined time window such that increased time delay between transmission and detection causes less of the pulse to be detected. Thus, the detected power level of the reflected or emitted pulse signal 48 is inversely proportional to the distance traveled. Other embodiments for measuring the distance between the sensor 50 and the target surface 23, as presently known in the art, may also be employed.

Figure 4:
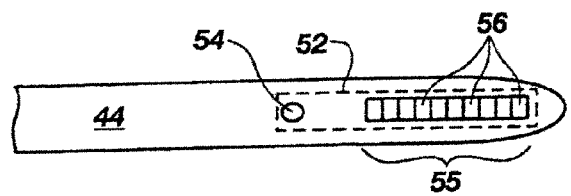
FIG. 4 is a top view schematic of a sensor configured to measure the erosion of a sputtering target surface according to one embodiment of the present invention.

FIG. 4 illustrates a top view schematic of a sensor 52 according to one embodiment of the present invention. The sensor 52 is attached to a thin profile arm 44, such as the arm 44 shown in FIG. 3A. Sensor 52 comprises a source element 54 and a detector array 55. The source element 54 has a thin profile so as to fit between the target 22 and the pedestal 24, as shown in FIG. 3A. The source element 54 is configured to generate a collimated light beam. By way of example only, and not by limitation, the source element 54 may comprise a laser diode. Alternatively, the source element 54 may comprise a collimator, such as a lens, configured to collimate or focus light exiting an optical fiber to a desired beam diameter or spot size. As will be seen below, the collimated light emitted from the source element 54 minimizes extraneous reflections and enhances signal detection. Use of a collimated light beam as an energy beam is currently preferred, although the invention is not so limited.

The detector array 55 comprises a plurality of detectors or detector elements 56 (ten shown) disposed side by side in a linear array, each detector 56 having a thin profile so as to fit between the target 22 and the pedestal 24, as shown in FIG. 3A. Each detector 56 in the detector array 55 is configured to produce an electronic sensory signal related to the magnitude of the radiation received thereon. By way of example only, and not by limitation, each detector may comprise a photodiode or a charge coupled device (hereinafter "CCD"). Alternatively, each detector 56 in the detector array 55 may comprise a collimator, such as a lens, configured to collect light into an optical fiber.

Figure 5:
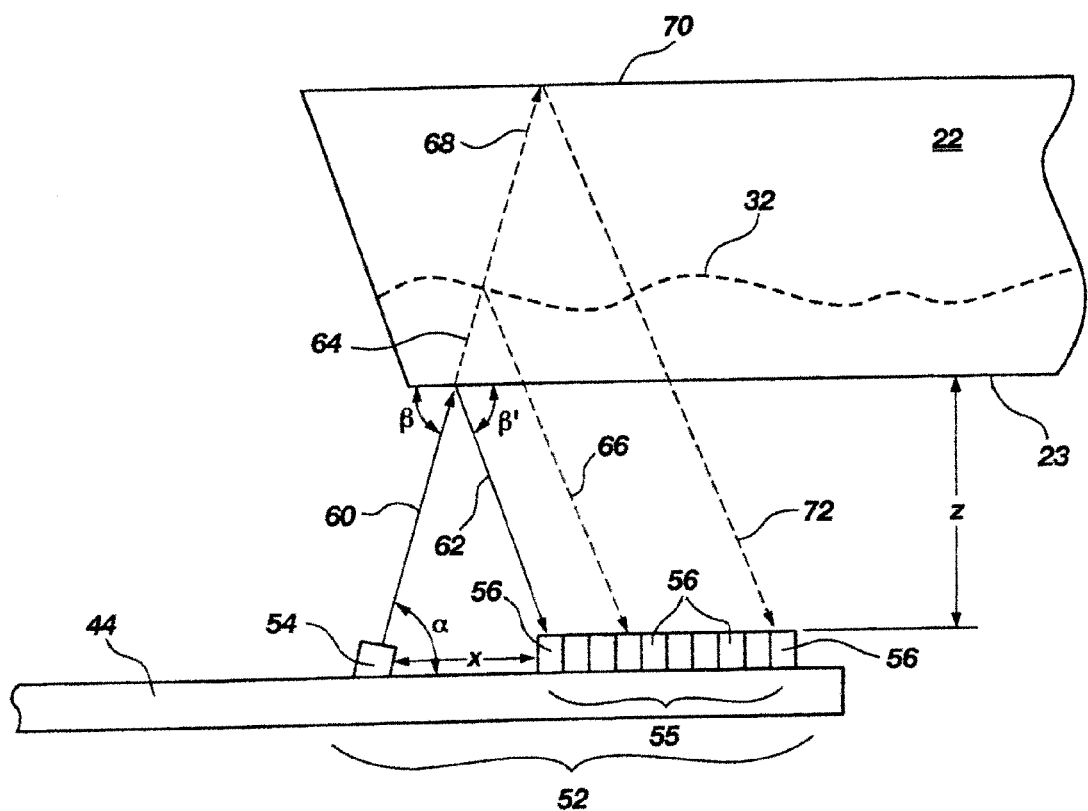
FIG. 5 is a side view schematic of the sensor of FIG. 4 and a portion of a sputtering apparatus.

FIG. 5 illustrates a side view schematic of the sensor 52 and arm 44 shown in FIG. 4. As shown in FIG. 5, the source element 54 is positioned so as to emit a transmitted beam 60 at a predetermined transmission angle $\alpha$ in relation to the arm 44. Although not shown, it may also be advantageous to position each detector 56 of the detector array 55 at an angle in relation to the arm 44 so as to align with a corresponding reflected beam, such as reflected beams 62, 66 and 72.

FIG. 5 also illustrates the sensor 52 positioned in relation to a portion of a target 22, such as the target 22 shown in FIG. 2. The number of detectors 56 in the detector array 55 and the position of each detector 56 relative to the source element 54 are dependent upon the distance between the sensor 52 and the target 22. For illustration purposes, three surfaces 23, 32, 70 are referenced in FIG. 5 corresponding to different target 22 erosion states. The first target surface 23 corresponds to a new or unused target 22 that has not yet been exposed to a sputtering process. The transmitted beam 60 illuminates the new target surface 23 and reflects back toward the detector array 55 as reflected beam 62. To configure the dimensions of the detector array 55, the vertical distance z between the new target surface 23 and the sensor 52 may be predetermined. Thus, assuming the incident angle $\beta$ of the transmitted beam 60 and the reflected angle $\beta'$ of the reflected beam 62 are equal, the distance x between the source element 54 and the nearest detector 56 in the detector array 55 (i.e., the detector 56 illuminated by the reflected beam 62) is given by:

$$x = 2\left(\frac{z}{\tan\alpha}\right) \quad (1)$$

The next target surface 32 shown in FIG. 5 corresponds to a target 22 that has been used in a sputtering process wherein approximately one-third of the target 22 material has been eroded. As discussed above in relation to FIG. 2, the target surface 32 has eroded unevenly. The transmitted beam 60, now represented by dashed line 64, illuminates the eroded target surface 32 and reflects back toward the detector array 55 as reflected beam 66. The reflected beam 66 illuminates a detector 56 in the detector array 55 located approximately one-third of the distance between the detector 56 located nearest the source element 54 and the detector 56 located farthest from the source element 54. Therefore, it may be determined that approximately one-third of the target 22 material has been eroded at the measured location along the target surface 32.

The next target surface 70 shown in FIG. 5 corresponds to the interface between the target 22 and the cathode assembly 18, as shown in FIG. 1. The transmitted beam 60, now represented by dashed line 68, illuminates the target interface surface 70 and reflects back toward the detector array 55 as reflected beam 72. The reflected beam 72 illuminates a detector 56 in the detector array 55 located farthest from the source element 54. Thus, it may be determined that substantially all of the target 22 material has been eroded at the measured location along the target interface surface 70. As discussed above, use of the present invention to detect target consumption prevents the target interface surface 70 from being punched through and exposing portions of the cathode assembly 18 to erosion from the sputtering process. Therefore, it may be advantageous to replace the target 22 before the target interface surface 70 is detected.

Figure 6:
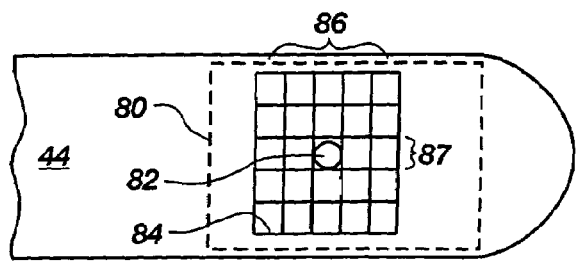
FIG. 6 is a top view schematic of a sensor comprising a transceiver and detectors, the sensor configured to the roughness of a sputtering target surface according to another embodiment of the present invention.

FIG. 6 illustrates a top view schematic of a sensor 80 according to another embodiment of the present invention. The sensor 80 is attached to a thin profile arm 44, such as the arm 44 shown in FIG. 3A. The sensor 80 comprises a transceiver 82 and a two-dimensional detector matrix 86 comprising a plurality of detectors 84 (24 shown). The transceiver 82 and the detectors 84 each have a thin profile so as to fit between the target 22 and the pedestal 24, as shown in FIG. 3A. As shown in FIG. 6, the transceiver 82 is positioned in row 87 of the detector matrix 86. Each detector 84 in the detector matrix 86 is configured to produce an electronic sensory signal related to the magnitude of the radiation received thereon. By way of example only, and not by limitation, each detector 84 may comprise a photodiode or a CCD. Alternatively, each detector 84 may comprise a collimator, such as a lens, configured to collect light into an optical fiber.

Figure 7:
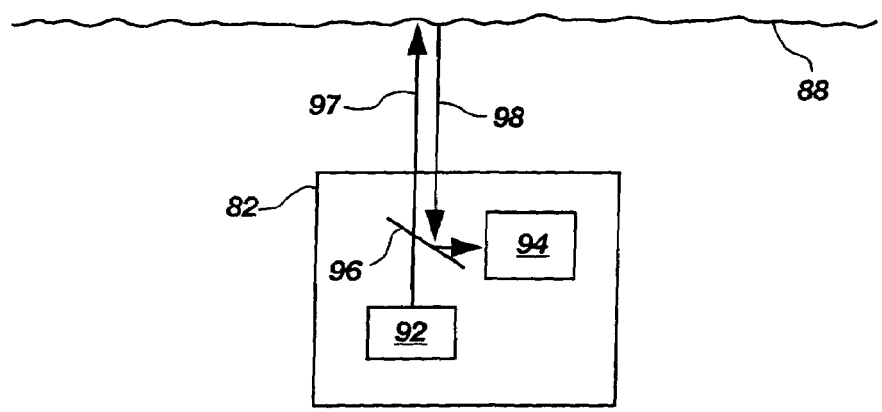
FIG. 7 is a side view schematic of the transceiver of FIG. 6 and a roughened target surface.
Figure 8:
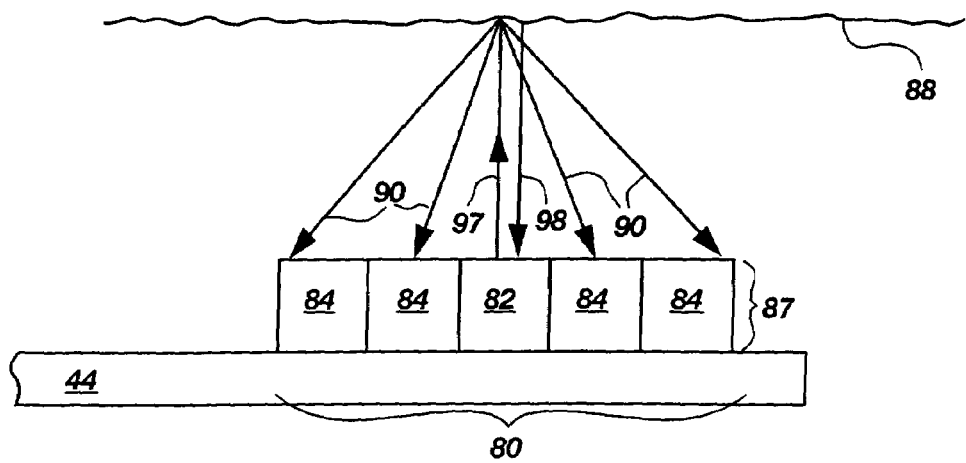
FIG. 8 is a partial side view schematic of the sensor of FIG. 6 and the roughened target surface shown in FIG. 7.

FIG. 7 illustrates a side view schematic of the transceiver 82 shown in FIG. 6 positioned in relation to a portion of a target surface 88. As shown in FIGS. 7 and 8, the target surface 88 has roughened during a deposition process. The transceiver 82 comprises a source element 92 and a detector 94. The transceiver 82 may also comprise a light-directing element 96, such as a mirror. The source element 92 is configured to transmit a coherent light beam 97 of wavelength $\lambda$ toward the roughened target surface 88. Use of a collimated coherent light beam as an energy beam is presently preferred, although the invention is not so limited. By way of example only, and not by limitation, the source element 92 may comprise a laser diode. Alternatively, the source element may comprise a collimator, such as a lens, configured to collimate or focus coherent light exiting an optical fiber to a desired beam diameter or spot size.

A first portion of the transmitted coherent light beam 97 is coherently reflected by the roughened target surface 88 in the specular direction back toward the transceiver 82 as reflected coherent beam 98 (offset for illustration only). The reflected coherent beam 98 is directed to the detector 94 by the light-directing element 96 where the power of the reflected coherent beam 98 is measured. By way of example only, and not by limitation, the detector 94 may comprise a photodiode or a CCD. Alternatively, the detector 94 may comprise a collimator, such as a lens, configured to collect the coherent light into an optical fiber.

FIG. 8 illustrates a side view schematic of the sensor 80 and arm 44 shown in FIG. 6. FIG. 8 also illustrates the sensor 80 positioned in relation to a portion of the roughened target surface 88. For illustrative purposes, FIG. 8 shows a cross-sectional view of the sensor 80 along row 87 of the detector matrix 86. As discussed above in relation to FIG. 7, the transceiver 82 is positioned and configured to illuminate a portion of the roughened target surface 88 with the transmitted coherent light beam 97 and to detect the reflected coherent beam 98. A second portion of the transmitted coherent light beam 97 is reflected and scattered by the roughened target surface 88 in a three-dimensional cone-like direction back toward the detectors 84 in the detector matrix 86 as scattered light beams 90 (four beams shown). The dimensions of the detector matrix 86 are configured and positioned to detect a substantial portion of the scattered light beams 90.

The roughness of the target surface 88 may be expressed as a root-mean-square surface roughness (hereinafter "RMS_Roughness") and may be determined as a function of the wavelength $\lambda$ of the transmitted coherent light beam 97, the detected power of the reflected coherent beam 98, and the detected power of the scattered light beams 90. From the detected coherent reflected beam 98 power (hereinafter "$P_{Coherent}$") and the detected scattered light 90 power (hereinafter "$P_{Scattered}$"), a scattering ratio is given by:

$$\text{Scattering Ratio} = \frac{P_{Scattered}}{P_{Scattered} + P_{Coherent}} \quad (2)$$

The ratio of the RMS_Roughness divided by the wavelength $\lambda$ of the transmitted coherent light beam 97, or RMS_Roughness/$\lambda$, is related to the scattering ratio in equation (2). If the target surface 88 is relatively smooth, $P_{Coherent}$ will be large compared to $P_{Scattered}$. Thus, the scattering ratio will be relatively small and the ratio RMS_Roughness/$\lambda$ will also be relatively small. As the target surface 88 becomes increasingly rough, $P_{Scattered}$ increases and $P_{Coherent}$ approaches zero. Thus, the scattering ratio becomes increasingly large and the ratio RMS_Roughness/$\lambda$ will also become increasingly large. Thus, for a given wavelength $\lambda$ of the transmitted coherent light beam 97, the RMS_Roughness may be characterized.

Figure 9:
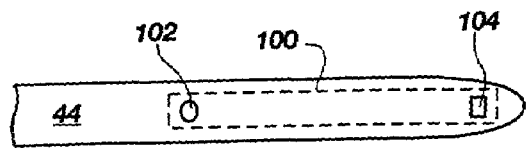
FIG. 9 is a top view schematic of a sensor configured to detect asperities on a sputtering target surface according to yet another embodiment of the present invention.

FIG. 9 illustrates a top view schematic of a sensor 100 according to another embodiment of the present invention. The sensor 100 is attached to a thin profile arm 44, such as the arm 44 shown in FIG. 3A. The sensor 100 comprises a source element 102 and a detector 104. The source element 102 and the detector 104 each have a thin profile so as to fit between the target 22 and the pedestal 24, as shown in FIG. 3A. The source element 102 is configured to generate an energy beam. By way of example only, and not by limitation, the source element 102 may comprise a laser diode. Alternatively, the source element 102 may comprise a collimator configured to collimate or focus light exiting an optical fiber to a desired beam diameter or spot size. The detector 104 is configured to produce an electronic sensory signal related to the magnitude of the energy beam received thereon. By way of example only, and not by limitation, the detector 104 may comprise a photodiode or a CCD. Alternatively, the detector 104 may comprise a collimator, such as a lens, configured to collect light into an optical fiber.

Figure 10:
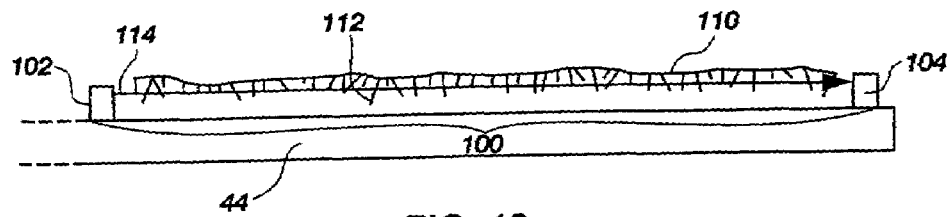
FIG. 10 is a side view schematic of the sensor of FIG. 9 and a portion of a target surface having asperities.

FIG. 10 illustrates a side view schematic of the sensor 100 shown in FIG. 9 positioned in relation to a portion of a target surface 110. As shown in FIG. 10, the target surface 110 comprises a plurality of asperities 112 that have grown thereon during a deposition process. As discussed above, the target surface 110 may comprise silver selenide or any target material which manifests protrusion defects. As shown in FIG. 10, the source element 102 is positioned and configured to emit an energy beam 114 substantially parallel to the target surface 110 toward the detector 104. The sensor 100 is configured and positioned such that the energy beam 114 illuminates or otherwise interacts with a portion of the asperities 112. Thus, it may be advantageous to move the sensor 100 in a plane perpendicular to the target surface 110 as well as in a plane parallel to the target surface 110. The presence of the asperities 112 on the target surface 110 is detected by an interruption of the energy beam 114 by a portion of the asperities 112 between the source element 102 and the detector 104. Similarly, the presence of the asperities 112 may be detected by a reduction in the intensity or power of the detected energy beam 114 caused by interactions with a portion of the asperities 112. Alternatively, the presence of the asperities 112 may be detected by measuring the roughness of the target surface 110 as described above in relation to FIGS. 6–8.

Figure 11:
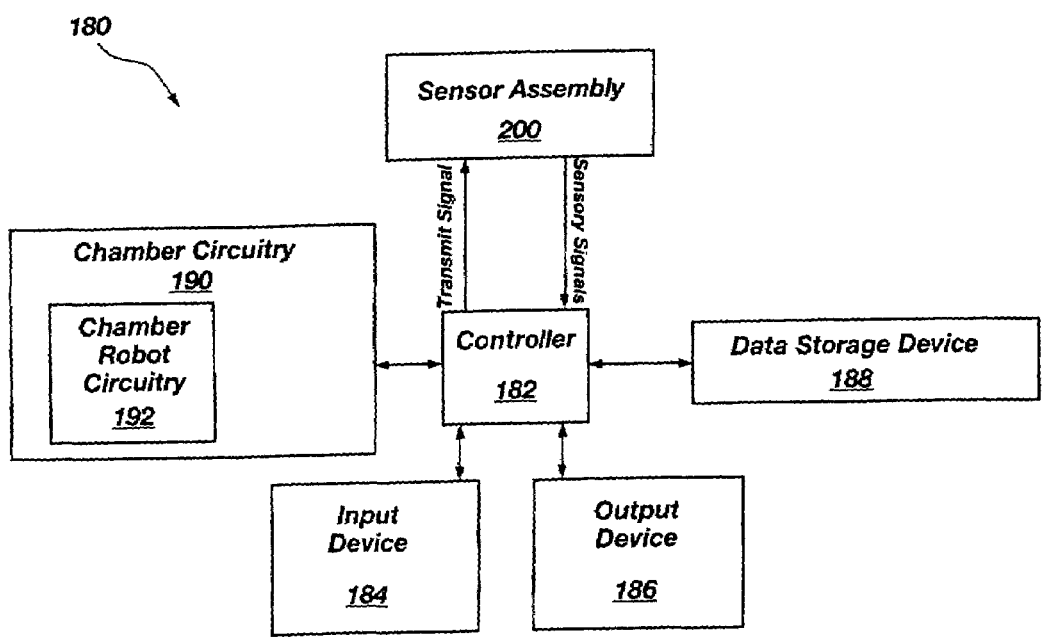
FIG. 11 is a block diagram of a sputter deposition system comprising a sensor assembly according to one embodiment of the present invention.

FIG. 11 is a block diagram of a sputter deposition system 180 according to the present invention. The sputter deposition system 180 comprises a controller 182 electrically coupled to chamber circuitry 190, a sensor assembly 200, an input device 184, an output device 186 and a data storage device 188. The controller 182 is configured to communicate an electronic transmit signal to the sensor assembly 200. Upon receipt of the transmit signal from the controller 182, the sensor assembly 200 is configured to transmit a beam of energy. The sensor assembly 200 is configured to generate electronic sensory signals related to the magnitude of an emitted, reflected or scattered energy beam received thereon. The controller 182 is configured to receive and analyze the sensory signals.

Referring to FIGS. 1 and 11, the sensor assembly 200 may be located substantially within the vacuum chamber 12. Alternatively, the sensor assembly 200 may be located substantially outside of the vacuum chamber 12 or partially outside the vacuum chamber 12. For example, the sensor assembly 200, or a portion thereof, may be located outside of the vacuum chamber 12 and configured to transmit the energy beam through the window 15. Similarly, the sensor assembly 200 may be configured to receive the emitted, reflected or scattered energy beam as it exits the same window 15 or a different window (not shown).

The controller 182 may be configured to interface with the chamber circuitry 190, including chamber robot circuitry 192, to control the position of the sensor assembly 200 or a portion thereof relative to a surface in the vacuum chamber 12, the placement and removal of a substrate 26 on the pedestal 24, sputter processing times, and other sputtering process and vacuum chamber 12 operations. The controller 182 may further be configured to perform computer functions such as executing software to perform desired calculations and tasks.

The input device 184 may include, by way of example only, an Internet or other network connection, a mouse, a keypad or any device that allows an operator to enter data into the controller 182. The output device 186 may include, by way of example only, a printer or a video display device. The data storage device 188 may include, by way of example only, drives that accept hard and floppy discs, tape cassettes, CD-ROM or DVD-ROM.

The sensor assembly 200 may comprise a sensor (not shown) such as the sensors discussed above or the embodiments disclosed below in FIGS. 12A–13. For example, the sensor assembly 200 may comprise the sensor 52 attached to the arm 44 shown in FIGS. 4 and 5. Referring to FIGS. 4, 5 and 11, the controller 182 is configured to communicate an electronic transmit signal to the source element 54. Upon receipt of the transmit signal from the controller 182, the source element 54 is configured to transmit a beam of collimated light. The beam of collimated light may be a pulsed beam of collimated light. Each detector 56 is configured to generate an electronic sensory signal related to the magnitude of the radiation received thereon. The controller 182 is configured to receive and compare each of the sensory signals to determine which one of the detectors 56 was illuminated with the greatest magnitude of radiation. The controller 182 may be configured to receive the sensory signals during a predefined time window in relation to the communication of the transmit signal to the source element 54.

The controller 182 is further configured to determine the relative distance from the sensor 52 to a target surface 23, 32, 70. As described above in relation to FIG. 5, the controller 182 may be configured to estimate the relative amount of erosion at a location along the target surface 23, 32, 70 according to the relative position of the detector 56 in the detector array 55 illuminated with the greatest amount of radiation. For example, if a detector 56 located at the center of the detector array 55 is determined by the controller 182 to be illuminated by a reflected beam, then the controller 182 may be configured to estimate that half of the target 22 material has been eroded at the position along the target surface 23, 32, 70 being measured. Alternatively, the distance from the sensor 52 to the target surface 23, 32, 70 may be determined as a function of the transmission angle α and the distance between the source element 54 and the detector 56 being illuminated. For example, if the transmission angle α and the distance x between the source element 54 and the nearest detector 56 in FIG. 5 are known, then equation (1) above may be used (assuming the incident angle β of the transmitted beam 60 and the reflected angle β' of the reflected beam 62 are equal) to determine the distance z between the sensor 52 and the target surface 23 as:

$$z = x\left(\frac{\tan\alpha}{2}\right) \qquad (3)$$

Figure 12A:
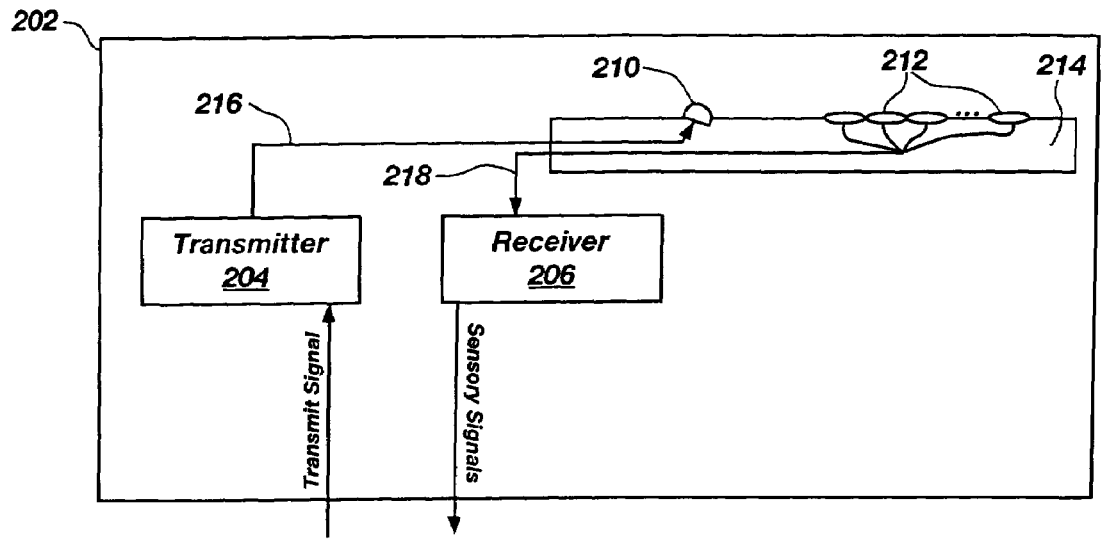
FIGS. 12A–12C are block diagrams of sensor assemblies according to one embodiment of the present invention.
Figure 12B:
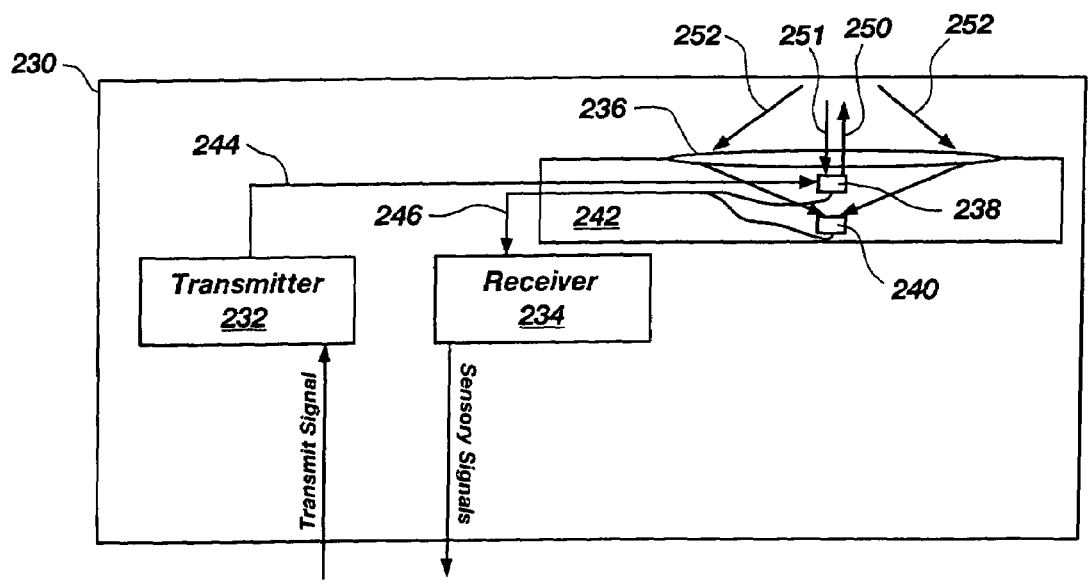
Figure 12C:
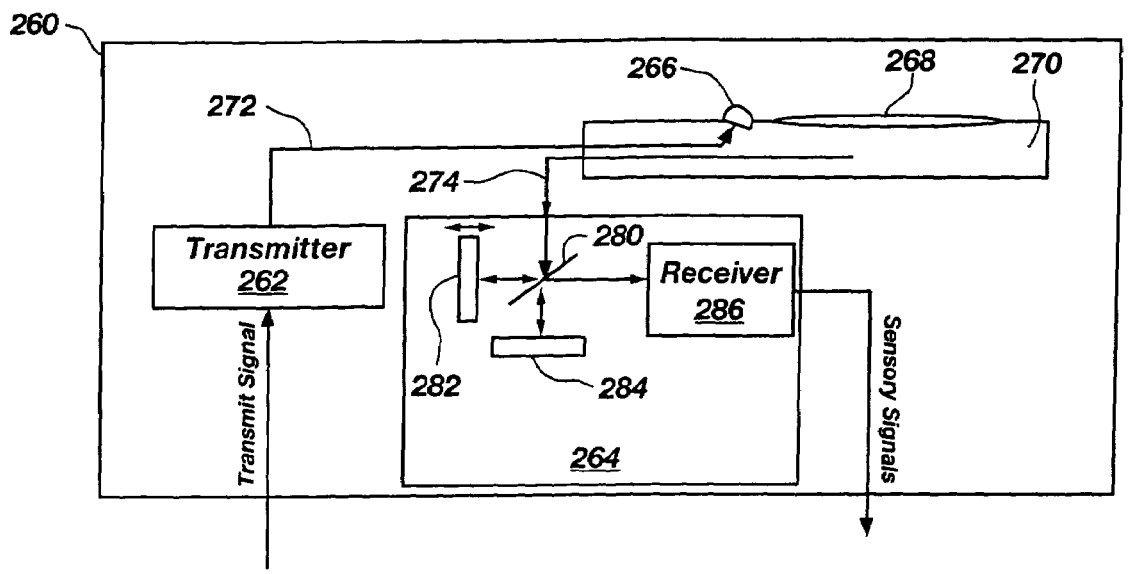

FIGS. 12A–12C illustrate block diagrams of sensor assemblies 202, 230, and 260, suitable for use as the sensor assembly 200 shown in FIG. 11. The sensor assemblies 202, 230, 260 shown in FIGS. 12A–12C employ fiber optics to reduce the size of a portion of the sensor assemblies 202, 230, 260 to be positioned within a sealed chamber (not shown), such as the vacuum chamber 12 shown in FIG. 1. FIG. 12A illustrates a block diagram of sensor assembly 202 according to one embodiment of the present invention. The sensor assembly 202 comprises a source element 210 and a plurality of reception elements 212 (four shown) attached to a thin profile arm 214, such as the arm 44 shown in FIGS. 4 and 5. The source element 210 comprises a collimator, such as a lens, configured to collimate or focus light exiting an optical fiber 216 to a desired beam diameter or spot size. Each reception element 212 comprises a collimator, such as a lens, configured to collect light incident thereon into an optical fiber assembly 218. The sensor assembly 202 further comprises a transmitter 204 coupled to the source element 210 through the optical fiber 216 and a receiver 206 coupled to each of the plurality of reception elements 212 through the optical fiber assembly 218. The optical fiber assembly 218 comprises a plurality of optical fibers, each optical fiber configured to couple to one reception element 212.

Referring to FIGS. 11 and 12A, the transmitter 204 is configured to receive a transmit signal from the controller 182 and to transmit a beam of collimated light to the source element 210 through the optical fiber 216. The beam of collimated light may be a pulsed beam of collimated light. For each reception element 212, the receiver 206 is configured to receive a light beam through the optical fiber assembly 218 and to generate an electronic sensory signal related to the magnitude of the radiation collected at the respective reception element 212. The receiver 206 is further configured to transmit each of the sensory signals to the controller 182. The controller 182 is configured to receive and compare each of the sensory signals to determine which one of the reception elements 212 was illuminated with the greatest magnitude of radiation. The controller 182 may be configured to receive the sensory signals during a predefined time window in relation to the communication of the transmit signal to the source element 210 from the transmitter 204. The controller 182 is further configured to determine the relative distance from the source element 210 to an object (not shown), as described above.

FIG. 12B illustrates a block diagram of sensor assembly 230 according to another embodiment of the present invention. The sensor assembly 230 comprises an imaging device 236, a transceiver 238 and a scattered light reception element 240 attached to a thin profile arm 242. The imaging device 236 may comprise a lens. The transceiver 238 is configured to emit a coherent light beam 250 and to receive a reflected coherent light beam 251 (offset for illustration only). The transceiver 238 comprises a source collimator (not shown), such as a lens, configured to collimate or focus the coherent light beam 250 exiting an optical fiber 244 to a desired beam diameter or spot size. The transceiver 238 also comprises a coherent light reception element (not shown). The transceiver 238 may also comprise a light-directing element (not shown), such as a mirror, configured to direct the coherent light beam 250 from the source collimator out of the transceiver 238 and/or to direct the reflected coherent light beam 251 into the transceiver 238 to the coherent light reception element. The coherent light reception element in the transceiver 238 and the scattered light reception element 240 each comprise a collimator, such as a lens, configured to collect light incident thereon into an optical fiber assembly 246. The sensor assembly 230 further comprises a transmitter 232 coupled to the transceiver 238 through the optical fiber 244 and a receiver 234 coupled to the transceiver 238 and to the scattered light reception element 240 through the optical fiber assembly 246.

Referring to FIGS. 11 and 12B, the transmitter 232 is configured to receive a transmit signal from the controller 182 and to transmit the coherent light beam 250 to the transceiver 238 through the optical fiber 244 where the source collimator emits the coherent light beam 250 through the imaging device 236. The imaging device 236 is configured to direct the reflected coherent light beam 251 to the transceiver 238 where it is passed to the receiver 234 through the optical fiber assembly 246. The imaging device 236 is further configured to direct scattered light beams 252 (two shown) to the scattered light reception element 240 where they are passed to the receiver 234 through the optical fiber assembly 246. The receiver 234 is configured to generate an electronic sensory signal in response to each of the received reflected coherent light beam 251 and scattered light beams 252. The receiver 234 is further configured to transmit each of the sensory signals to the controller 182. The controller 182 is configured to receive and analyze the sensory signals as described above in relation to FIGS. 6–8 to determine the roughness of a surface (not shown) illuminated by the coherent light beam 250.

FIG. 12C illustrates a block diagram of sensor assembly 260 according to yet another embodiment of the present invention. The sensor assembly 260 comprises a source element 266 and a reception element 268 attached to a thin profile arm 270. The source element 266 comprises a collimator, such as a lens, configured to collimate or focus light exiting an optical fiber 272 to a desired beam diameter or spot size. The reception element 268 also comprises a collimator, such as a lens, configured to collect emitted, reflected or scattered light incident thereon into an optical fiber 274. The sensor assembly 260 further comprises a transmitter 262 coupled to the source element 266 through the optical fiber 272 and a spectrometer 264 coupled to the reception element 268 through the optical fiber 274.

Referring to FIGS. 11 and 12C, the transmitter 262 is configured to receive a transmit signal from the controller 182 and to transmit a beam of collimated light to the source element 266 through the optical fiber 272. The beam of collimated light may comprise multiple wavelengths. The spectrometer 264 is configured to receive the collected light incident upon the reception element 268 through the optical fiber 274 and to analyze the collected light using spectroscopy techniques. The spectrometer 264 is further configured to generate electronic sensory signals related to the spectroscopic analysis and to transmit the sensory signals to the controller 182. The controller 182 is configured to receive the sensory signals and to correlate the sensory signals to spectra previously stored in a database in the data storage device 188. Thus, the sensory signals may be correlated to compositional data to determine elemental, isotropic and structural characteristics of a surface (not shown) illuminated by the transmitted beam of collimated light. For example, as discussed above, the sensory signals may be correlated to determine the amount and composition of residue deposits on the inner chamber wall 13 shown in FIG. 3C.

The spectrometer 264 shown in FIG. 12C employs a Michelson interferometer. However, the scope of the present invention includes all spectrometers and spectroscopy techniques presently known in the art. The spectrometer 264 comprises a beam splitter 280, a moving mirror 282, a fixed mirror 284 and a receiver 286. As an example of one spectroscopy technique suitable for use with the present invention, the spectrometer 264 may be used with Fourier-transform techniques to perform FTIR spectroscopy on the collected light incident upon the reception element 268. In this example, it is assumed that the collimated light beam transmitted by source element 266 is an IR light beam and that the collected light incident upon the reception element 268 is a reflection of the IR light beam from a surface, such as the inner chamber wall 13 shown in FIG. 3C. The reflected IR light beam exiting the optical fiber 274 is directed onto the beam splitter 280. The beam splitter 280 directs approximately half of the reflected IR light beam to the moving mirror 282 and approximately half of the reflected IR light beam to the fixed mirror 284. After reflecting off the moving mirror 282 and the fixed mirror 284, the components of the reflected IR light beam are recombined by the beam splitter 280 and directed to the receiver 286. The moving mirror 282 and the fixed mirror 284 produce constructive and destructive interference in the recombined IR light beam which is detected by the receiver 286. The receiver 286 is configured to convert the detected interference into sensory signals, which are then analyzed by the controller 182 in FIG. 11 to determine the concentration and composition of the surface being analyzed.

Figure 13:
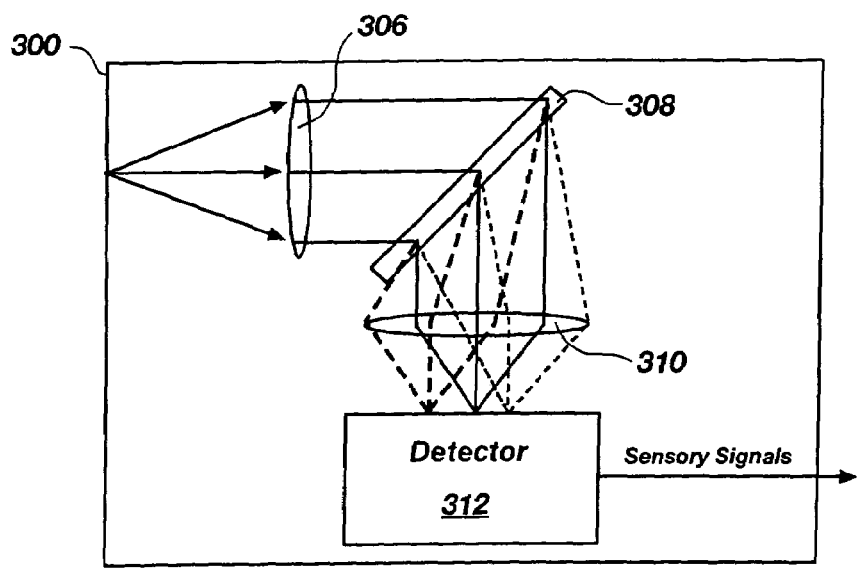
FIG. 13 is a block diagram of a receiver suitable for use in the sensor assembly of FIG. 12C.

As another example of a spectroscopy technique suitable for use with the present invention, the spectrometer 264 may be used to perform Raman spectroscopy on the collected light incident upon the reception element 268. In this example, it is assumed that the collimated light beam transmitted by source element 266 comprises multiple wavelengths and that the collected light incident upon the reception element 268 is Raman scattered light from a surface illuminated with the collimated light beam, such as the inner chamber wall 13 shown in FIG. 3C. In this example, the Raman scattered light is processed by the spectrometer 264 as described above. However, the Raman scattered light undergoes additional Raman spectroscopy once it reaches the receiver 286. FIG. 13 illustrates a receiver 300, such as the receiver 286 shown in FIG. 12C, configured to perform Raman spectroscopy.

The receiver 300 comprises a first lens 306, a grating 308, a second lens 310, and a detector 312. The Raman scattered light is directed onto the grating 308 by the first lens 306. The grating 308 disperses the Raman scattered light through the second lens 310 where it is focused onto the detector 312. The detector 312 may be selected from the group comprising a CCD camera, an intensified CCD detector, a charge injection device, a photomultiplier tube detector array, a photodiode array (hereinafter "PDA"), an intensified PDA, or an avalanche photodiode array. The detector 312 is configured to generate sensory signals representative of the Raman spectra received thereon. The sensory signals are then analyzed by the controller 182 in FIG. 11 and compared to Raman spectra previously stored in a database in the data storage device 188. Thus, structural analysis, multicomponent qualitative analysis, and quantitative analysis may be performed to determine the characteristics of the surface being analyzed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. An apparatus for measuring at least one characteristic of a surface in a chamber, the apparatus comprising:

a sensor configured to emit a first energy beam relative to the surface, detect a second energy beam therefrom and provide an output signal from which at least one characteristic associated with the surface may be determined; and an arm coupled to the sensor, the arm configured to transport the sensor relative to the surface.

2. The apparatus of claim 1, wherein the first energy beam comprises a visible light beam, an ultraviolet light beam, an infrared light beam, a radio frequency beam, a microwave beam or an ultrasound beam.

3. The apparatus of claim 1, further comprising a pedestal positioned proximate a target surface, the target surface comprising the surface in the chamber, wherein the sensor and the arm coupled thereto are configured, positioned and sized to enter a gap between the target surface and the pedestal, wherein the arm is further configured to transport the sensor into the gap without contacting the pedestal or target surface.

4. The apparatus of claim 3, wherein the sensor is configured to measure at least one characteristic comprising at least one of target surface roughness and a presence of asperities on the target surface.

5. The apparatus of claim 3, wherein the sensor comprises:

a transceiver configured to emit the first energy beam toward the target surface and to detect a first portion of the second energy beam; and at least one first detector configured to detect a second portion of the second energy beam.

6. The apparatus of claim 5, wherein the first portion of the second energy beam comprises a coherently reflected portion of the first energy beam from the target surface, and the second portion of the second energy beam comprises a scattered portion of the first energy beam from the target surface.

7. The apparatus of claim 5, wherein the at least one first detector is disposed in a matrix surrounding the transceiver.

8. The apparatus of claim 5, further comprising an imaging device configured to direct the first portion of the second energy beam to the transceiver and to direct the second portion of the second energy beam to the at least one first detector.

9. The apparatus of claim 5, wherein the transceiver comprises a second detector and a source element configured to emit the first energy beam.

10. The apparatus of claim 9, wherein the transceiver further comprises a light-directing element configured to direct the first portion of the second energy beam to the second detector.

11. The apparatus of claim 9, wherein the source element comprises a collimator configured to collimate the first energy beam as it exits an optical fiber.

12. The apparatus of claim 11, further comprising a transmitter optically coupled to the source element through the optical fiber, the transmitter configured to transmit the first energy beam to the collimator.

13. The apparatus of claim 9, wherein the at least one first detector and the second detector each comprise a collimator configured to collect the second energy beam incident thereon into a corresponding optical fiber.

14. The apparatus of claim 13, further comprising a receiver optically coupled to the at least one first detector and the second detector through each corresponding optical fiber, the receiver configured to generate an electronic sensory signal for each collimator related to a magnitude of the second energy beam incident thereon.

15. The apparatus of claim 3, wherein the sensor comprises a detector and a source element configured to emit the first energy beam toward the detector.

16. The apparatus of claim 15, wherein the source element is further configured and positioned to emit the first energy beam substantially parallel to the target surface and to illuminate an asperity thereon.

17. The apparatus of claim 1, wherein the sensor is configured to characterize material deposited on the surface in the chamber.

18. The apparatus of claim 17, further comprising:
a transmitter optically coupled to the sensor, the transmitter configured to transmit the first energy beam to the sensor; and
a spectrometer optically coupled to the sensor, the spectrometer configured to generate sensory signals related to spectra of the second energy beam incident thereon.

19. The apparatus of claim 18, wherein the spectrometer is selected from the group consisting of a Raman spectrometer and an infrared absorption spectrometer.

20. The apparatus of claim 18, wherein the spectrometer comprises:
a first mirror;
a second mirror configured to move relative to the first mirror;
a beam splitter interposed between the first mirror and the second mirror; and
a receiver configured to generate the sensory signals.

21. The apparatus of claim 20, wherein the receiver comprises:
a grating configured to disperse the second energy beam; and
a detector configured to generate sensory signals related to Raman spectra of the dispersed second energy beam.

22. A method for measuring the roughness of a sputtering target surface, the method comprising:
selectively positioning a sensor relative to the target surface;
illuminating a portion of the target surface with an energy beam;
detecting a coherently reflected portion of the energy beam;
detecting a scattered portion of the energy beam; and
relating a ratio of the coherently reflected portion of the energy beam and the scattered portion of the energy beam to a surface roughness.

23. The method of claim 22, wherein selectively positioning the sensor comprises moving the sensor.

24. The method of claim 22, wherein selectively positioning the sensor comprises inserting the sensor into a gap between the target surface and a pedestal positioned proximate the target surface.

25. The method of claim 22, wherein illuminating the portion of the target surface with the energy beam comprises emitting a coherent light beam from the sensor.

26. The method of claim 25, wherein emitting the coherent light beam comprises collimating the coherent light beam as it exits an optical fiber.

27. The method of claim 22, wherein detecting comprises collecting the coherently reflected portion of the energy beam and the scattered portion of the energy beam into a plurality of optical fibers.

28. A method for detecting asperities on a sputtering target surface, the method comprising:
selectively positioning a sensor relative to a portion of the target surface;
emitting an energy beam substantially parallel to the target surface;
illuminating a portion of the asperities with the energy beam; and
measuring a change in the energy beam.

29. The method of claim 28, wherein selectively positioning the sensor comprises moving the sensor on an arm.

30. The method of claim 28, wherein selectively positioning the sensor comprises inserting the sensor into a gap between the target surface and a pedestal positioned proximate the target surface.

31. The method of claim 28, wherein emitting the energy beam comprises collimating the energy beam as it exits an optical fiber.

32. The method of claim 28, wherein measuring the change in the energy beam comprises:
detecting the energy beam after illuminating the portion of the asperities; and
sensing a reduction in power between the emitted energy beam and the detected energy beam.

33. The method of claim 32, wherein detecting comprises collecting the energy beam into an optical fiber.

34. A method for analyzing deposits on a surface in a sputtering chamber, the method comprising:
selectively positioning a sensor relative to a portion of the surface;
illuminating the portion of the surface with a first energy beam;
detecting a second energy beam from the portion of the surface illuminated; and
performing a spectral analysis on the detected second energy beam.

35. The method of claim 34, wherein selectively positioning the sensor comprises moving the sensor to a location proximate the portion of the surface.

36. The method of claim 34, wherein selectively positioning the sensor comprises placing the sensor proximate a window outside the sputtering chamber.

37. The method of claim 36, further comprising emitting the first energy beam into the sputtering chamber through the window.

38. The method of claim 34, wherein illuminating the portion of the surface with the first energy beam comprises emitting an infrared light beam from the sensor.

39. The method of claim 38, wherein performing the spectral analysis comprises employing Fourier-transform infrared spectroscopy.

40. The method of claim 34, wherein illuminating the portion of the surface with the first energy beam comprises emitting a light beam having multiple wavelengths from the sensor.

41. The method of claim 40, wherein detecting the second energy beam comprises receiving a Raman scattered light beam as the second energy beam.

42. The method of claim 41, wherein performing the spectral analysis comprises employing Raman spectroscopy.

43. A sputter deposition system comprising:
a chamber;
a sensor assembly configured to measure at least one characteristic of a surface in the chamber;
an arm configured to attach to a portion of the sensor assembly, the arm configured to selectively transport the portion of the sensor assembly in the chamber; and
a controller electrically coupled to the sensor assembly.

44. The sputter deposition system of claim 43, wherein the at least one characteristic of the surface in the chamber is selected from the group consisting of erosion of the surface, roughness of the surface, a presence of asperities on the surface, a composition of deposits on the surface, and a concentration of deposits on the surface.

45. The sputter deposition system of claim 43, wherein the portion of the sensor assembly attached to the arm comprises a source element and at least one detector.

46. The sputter deposition system of claim 45, wherein the source element and the at least one detector each comprise a collimator configured to interface light with an optical fiber.

47. The sputter deposition system of claim 43, wherein the sensor assembly comprises:

a transmitter configured to receive a first electronic signal from the controller and to emit a first energy beam; and a receiver configured to receive a second energy beam and to communicate a second electronic signal related to the second energy beam to the controller.

48. The sputter deposition system of claim 47, wherein the receiver comprises a spectrometer.

49. The sputter deposition system of claim 43, further comprising a robot electrically coupled to the controller, the robot configured to move the arm relative to the surface in the chamber.

50. The sputter deposition system of claim 49, further comprising at least one peripheral device configured to electrically couple to the controller, wherein the at least one peripheral device is selected from the group consisting of chamber circuitry, an input device, an output device and a data storage device.

* * * * *